(12) United States Patent
Herron et al.

(10) Patent No.: US 8,563,856 B2
(45) Date of Patent: Oct. 22, 2013

(54) ELECTRONIC DEVICES MADE WITH METAL SCHIFF BASE COMPLEXES

(75) Inventors: Norman Herron, Newark, DE (US);
Ying Wang, Wilmington, DE (US);
Lucy M. Clarkson, Kennett Square, PA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 197 days.

(21) Appl. No.: 13/070,200

(22) Filed: Mar. 23, 2011

(65) Prior Publication Data

US 2011/0186835 A1    Aug. 4, 2011

Related U.S. Application Data

(62) Division of application No. 11/207,083, filed on Aug. 18, 2005, now abandoned.

(60) Provisional application No. 60/602,428, filed on Aug. 18, 2004.

(51) Int. Cl.
*H01L 31/00* (2006.01)

(52) U.S. Cl.
USPC .......................... 136/263; 252/62.2

(58) Field of Classification Search
USPC ......................................... 136/263
See application file for complete search history.

(56) References Cited

U.S. PATENT DOCUMENTS

| | | | |
|---|---|---|---|
| 5,030,743 A * | 7/1991 | McDowell | 556/148 |
| 6,303,238 B1 | 10/2001 | Thompson et al. | |
| 6,800,775 B1 * | 10/2004 | Bachmann et al. | 556/34 |
| 2001/0019782 A1 | 9/2001 | Igarashi et al. | |
| 2003/0129452 A1 * | 7/2003 | Tsuji et al. | 428/690 |
| 2005/0129978 A1 * | 6/2005 | Nakashima et al. | 428/690 |

FOREIGN PATENT DOCUMENTS

| | | |
|---|---|---|
| EP | 1 191 612 A2 | 3/2002 |
| EP | 1 191 614 A2 | 3/2002 |
| WO | WO 00/70655 A2 | 11/2000 |
| WO | WO 01/41512 A1 | 6/2001 |
| WO | WO 02/02714 A2 | 1/2002 |
| WO | WO 02/15645 A1 | 2/2002 |

OTHER PUBLICATIONS

John Markus, Electronics and Nucleonics Dictionary, pp. 470 and 476, McGraw-Hill, Inc, 1966, pp. 470-476.
G. Gustafsson et al., Flexible Light-Emitting Diodes Made From Soluble Conducting Polymer, Nature, 1992, pp. 477-479, vol. 357.
Y. Wang, Photoconductive Polymers, Kirk-Othmer Encyclopedia of Chemical Technology, Fourth Edition, 1996, pp. 837-860, vol. 18.
Bradlet et al., Electrophosphoresence From a Doped Polymer Light Emitting Diode, Synth. Met., 2001, pp. 379-383, vol. 2001.
Campbell et. al., Excitation Transfer Processes in a Phosphor-Doped Poly(P-Phenylene Vinelene) Light-Emitting Diode, Phys. Rev. B, 2002, vol. 65 085210.
Handbook of Chemistry and Physics, 81$^{st}$ Edition, 2000 (Book Not Included).

* cited by examiner

*Primary Examiner* — Miriam Berdichevsky

(57) ABSTRACT

The present invention relates to new electronic devices including a layer comprising a photoactive material and metal Schiff base complex, wherein the metal Schiff base complex is present as a host for the photoactive material or in a layer between the cathode and the photoactive material containing layer, or both.

2 Claims, 2 Drawing Sheets

ELECTRONIC DEVICES MADE WITH METAL SCHIFF BASE COMPLEXES

RELATED APPLICATION INFORMATION

This application claims priority to U.S. application Ser. No., 11/207,083, filed Aug. 18, 2005, which claims priority to U.S. Provisional Application No. 60/602,428, filed Aug. 18, 2004.

BACKGROUND OF THE INVENTION

1. Field of the Invention

The present invention relates to electronic devices having a layer comprising a metal Schiff base complex. In particular, the metal Schiff base complex is in an electron transport or hole-blocking layer, or is a host for a light-emitting material.

2. Background

In organic photoactive electronic devices, such as light-emitting diodes ("OLED"), that make up OLED displays, the organic active layer is sandwiched between two electrical contact layers in an OLED display. In an OLED the organic photoactive layer emits light through the light-transmitting electrical contact layer upon application of a voltage across the electrical contact layers.

It is well known to use organic electroluminescent compounds as the active component in light-emitting diodes. Simple organic molecules, conjugated polymers, and organometallic complexes have been used.

Devices which use photoactive materials, frequently include one or more charge transport layers, which are positioned between the photoactive (e.g., light-emitting) layer and one of the contact layers. A hole transport layer may be positioned between the photoactive layer and the hole-injecting contact layer, also called the anode. An electron transport layer may be positioned between the photoactive layer and the electron-injecting contact layer, also called the cathode.

There is a continuing need for charge transport materials.

SUMMARY OF THE INVENTION

There is provided a new organic electronic device comprising a layer comprising a photoactive material and a metal Schiff base complex, wherein the metal Schiff base complex is present as a host for the photoactive material or included within another layer between the cathode and the photoactive material containing layer or both layers.

In one embodiment, the metal Schiff base complex has Formula I, $$M(SB)_a L^1_b \quad \text{Formula (I)}$$

wherein:
- M is a metal in a +3 oxidation state;
- SB is a Schiff base ligand;
- $L^1$ is a ligand having the formula Ar—O, where Ar is selected from an aromatic group and a heteroaromatic group;
- a is 1, 2, or 3;
- b is 0, 1, or 2;

with the proviso that the metal Schiff base complex is electrically uncharged.

In one embodiment, the Schiff base ligand is selected from Structure I, II, III, and IV, below:

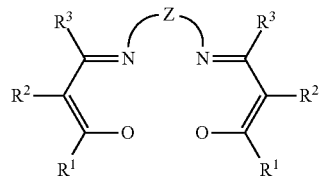

Structure (I)

wherein:
- $R^1$, $R^2$, $R^3$ are the same or different and are independently selected from hydrogen, alkyl, heteroalkyl, aryl, and heteroaryl, or adjacent R groups can join together to form 5- or 6-membered rings; and
- Z is selected from alkylene, heteroalkylene, arylene, and heteroarylene;

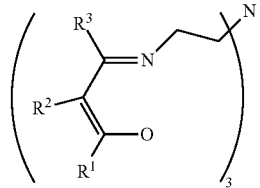

Structure (II)

wherein $R^1$, $R^2$, and $R^3$ are as defined above;

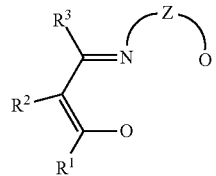

Structure (III)

wherein $R^1$, $R^2$, $R^3$, and Z are as defined above;

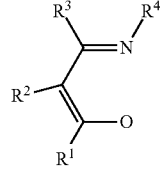

Structure (IV)

wherein
- $R^1$, $R^2$, and $R^3$ are as defined above;
- $R^4$ is selected from hydrogen, alkyl, heteroalkyl, aryl, and heteroaryl.

The foregoing general description and the following detailed description are exemplary and explanatory only and are not restrictive of the invention, as defined in the appended claims.

DESCRIPTION OF THE DRAWINGS

The invention is illustrated by way of example and not limitation in the accompanying figures.

Figure 1:
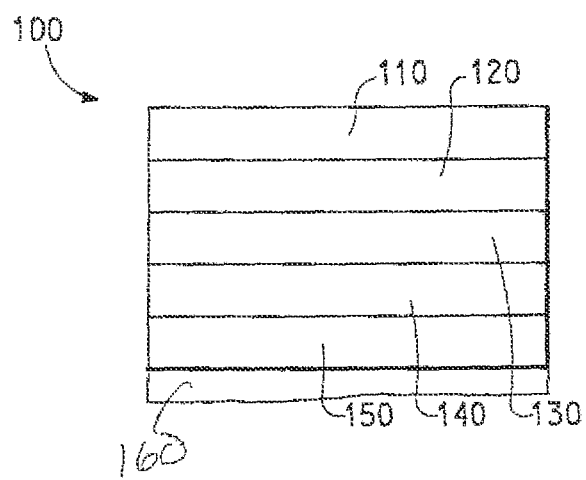
FIG. 1: An illustrative example of one new organic electronic device.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION OF THE PREFERRED EMBODIMENTS

A new organic electronic device comprises a layer comprising a photoactive material a metal Schiff base complex, wherein the metal Schiff base complex is present as a host for the photoactive material or where the Schiff base complex is included in another layer between the cathode of the electronic device and the photoactive material containing layer or both layers. In one embodiment, the layer including the Schiff base complex is in the layer immediately adjacent to the either the layer comprising the photoactive material or the cathode. In one embodiment, the Schiff base complex is included in a layer that is not immediately adjacent to either the photoactive materials or the cathode. In one embodiment, a Schiff base complex is present as a host for the photoactive material and at least one second adjacent layer as mention above.

As used herein, the term "photoactive" is intended to mean a material that emits light when activated by an applied voltage (such as in a light-emitting diode or light-emitting electrochemical cell), a material that responds to radiant energy and generates a signal with or without an applied bias voltage (such as in a photodetector), or a material that converts radiation into an electrical signal (such as in a photovoltaic cell).

The term "complex", when used as a noun, is intended to mean a compound having at least one metallic ion and at least one ligand. The term "ligand" is intended to mean a molecule, ion, or atom that is attached to the coordination sphere of a metallic ion. The term "Schiff base" refers to a compound formed by a condensation reaction between a primary amine (aliphatic or aromatic) and an aldehyde or ketone. The term "metal Schiff base complex" refers to a metal complex having one or more Schiff base ligands. The term "host" refers to a material which is present with a photoactive material. The host facilitates light emission by the photoactive material. In one embodiment, the host is present in an amount greater than 50% by weight, based on the total weight of the photoactive layer.

In one embodiment, the metal Schiff base complex has Formula I,

  Formula I wherein:
M is a metal in a +3 oxidation state;
SB is a Schiff base ligand;
$L^1$ is a ligand having the formula Ar—O, where Ar is selected from an aromatic group and a heteroaromatic group;
a is 1, 2, or 3;
b is 0, 1, or 2;
with the proviso that the metal Schiff base complex is electrically uncharged.

In one embodiment of Formula I, the metal is selected from Al, Zn, and Ga. In one embodiment, the metal is Al.

In one embodiment of Formula I, the Schiff base ligand is selected from Structure I, II, III, and IV, below:

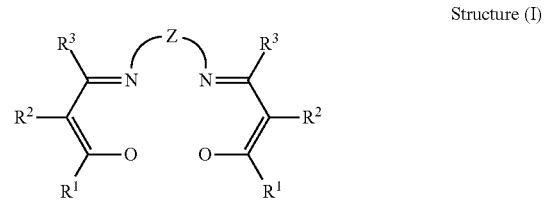

Structure (I)

wherein:
$R^1$, $R^2$, $R^3$ are the same or different and are independently selected from hydrogen, alkyl, heteroalkyl, aryl, and heteroaryl, or adjacent R groups can join together to form 5- or 6-membered rings; and
Z is selected from alkylene, heteroalkylene, arylene, and heteroarylene;

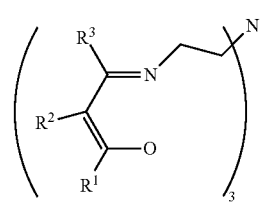

Structure (II)

wherein $R^1$, $R^2$, and $R^3$ are as defined above;

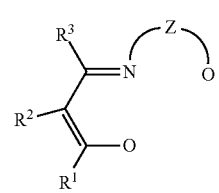

Structure (III)

wherein
$R^1$, $R^2$, $R^3$, and Z are as defined above;

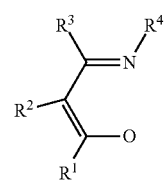

Structure (IV)

wherein
$R^1$, $R^2$, and $R^3$ are as defined above;
$R^4$ is selected from hydrogen, alkyl, heteroalkyl, aryl, and heteroaryl.

Although not shown, each of the oxygen atoms in the above structures carries a negative charge. The Schiff base ligands are derived from electrically uncharged Schiff base compounds in which each oxygen is bonded to a hydrogen atom.

In one embodiment, the metal Schiff base complex has Formula I(a)

  Formula I(a)

and SB has Structure I. The metal is pentacoordinate when no coordinating atom is present in Z, and hexacoordinate when a coordinating atom is present.

In one embodiment of Structure I, both R¹ are the same and both R² are the same. In one embodiment, in each instance adjacent R¹ and R² join together to form a 6-membered aromatic ring. In one embodiment, the aromatic ring is further substituted with a group selected from an alkyl group, a heteroalkyl group, an alkenyl group, a heteroalkenyl group, an alkynyl group, a heteroalkynyl group, an aryl group, including fused rings, a heteroaryl group, an alkoxy group, an aryloxy group, and halide.

In one embodiment of Structure I, R³ is selected from hydrogen, phenyl, and methyl.

Examples of suitable groups for Z include, but are not limited to, alkylene having from 1-20 carbon atoms, phenylene, arylene having from 2 to 4 fused rings, bi-arylene, and aza-alkylene having from 2-20 carbon atoms. Such groups can be unsubstituted or substituted.

In one embodiment of Structure I, Z is selected from alkylene having from 1-6 carbon atoms; 1,2-cyclohexylene; 1,2-phenylene; 4-methoxy-1,2-phenylene; 4,5-dimethyl-1,2-phenylene; o-binaphthalene-diyl; 3-aza-1,5-pentylene; 1,2-o-tolyl-1,2-ethylene; 1,2-dicyano-1,2-ethylene; and 2-p-t-butylbenzyl-1,3-propylene.

In one embodiment of Structure I, Z is selected from ethylene, 1,2-cyclohexylene, and —CH₂CH₂NHCH₂CH₂—. The 1,2-cyclohexylene can be in either a cis or trans configuration.

In one embodiment of Formula I(a), Ar is selected from phenyl, biphenyl, and naphthyl. In one embodiment, the aromatic ring is further substituted with a group selected from an alkyl or aryl group.

In one embodiment, the metal Schiff base complex having Formula I(a) is selected from Complexes 1 through 6 below:

Complex 1

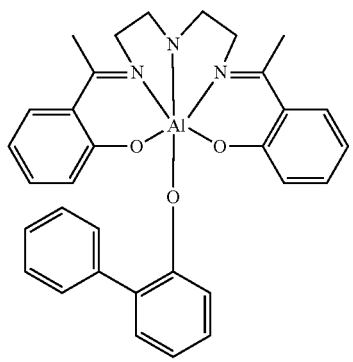

Complex 2

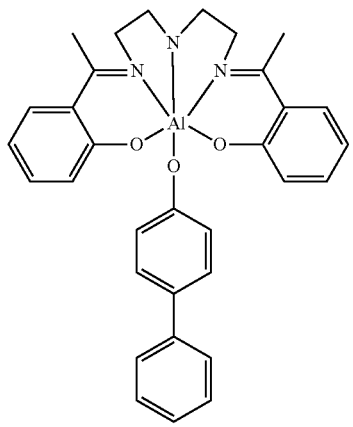

Complex 3

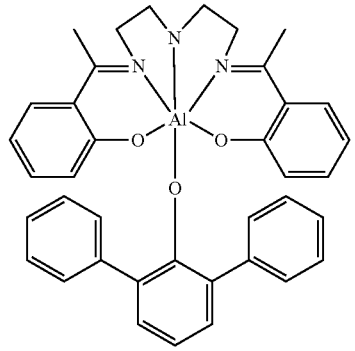

Complex 4

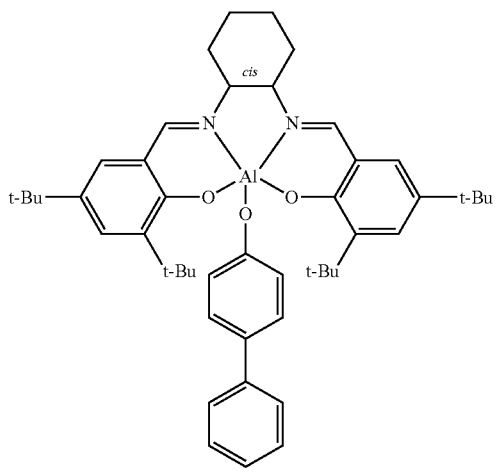

Complex 5

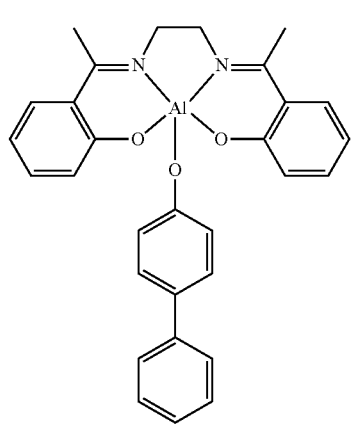

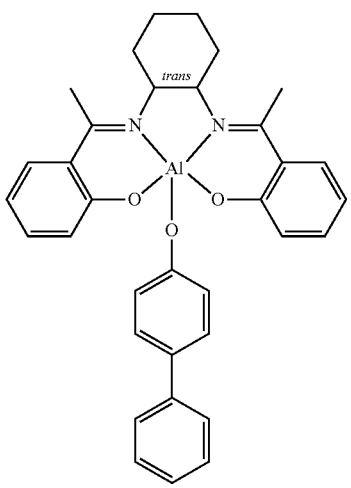

Complex 6

In one embodiment, the metal Schiff base complex has Formula I(b),

M(SB)   Formula I(b)

and SB has Structure II. The metal is pentacoordinate.

In one embodiment of Structure II, all $R^1$ are the same and all $R^2$ are the same. In one embodiment, in each instance adjacent $R^1$ and $R^2$ join together to form a 6-membered aromatic ring. In one embodiment SB has Structure II(a):

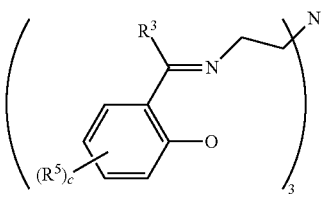

Structure II(a)

where there are from 0 to 4 $R^5$ groups, and each
$R^5$ is the same or different at each occurrence and is independently selected from an alkyl group, a heteroalkyl group, an alkenyl group, a heteroalkenyl group, an alkynyl group, a heteroalkynyl group, an aryl group, a heteroaryl group, an alkoxy group, an aryloxy group, an amino group, and halide, or adjacent $R^5$ groups can be joined together to form 5- or 6-membered rings; and
c is 0, 1, 2, 3, or 4.

In one embodiment, $R^5$ is selected from t-butyl, methoxy, chloro, diethylamino, and fused phenyl, and c is 1 or 2.

In one embodiment of Structure II, $R^3$ is selected from hydrogen, phenyl, and methyl.

In one embodiment, the metal Schiff base complex has Formula I(a) and SB has Structure III. When there is no coordinating atom in Z, the metal is tetracoordinate. When a coordinating atom is present in Z, the metal is pentacoordinate.

In one embodiment of Structure III, $R^1$ and $R^2$ join together to form a 6-membered aromatic ring. In one embodiment, the aromatic ring is further substituted with a group selected from an alkyl group, a heteroalkyl group, an alkenyl group, a heteroalkenyl group, an alkynyl group, a heteroalkynyl group, an aryl group, including fused rings, a heteroaryl group, an alkoxy group, an aryloxy group, and halide. In one embodiment, the aromatic ring is selected from fluorophenyl and alkylphenyl, where the alkyl has from 1 to 6 carbon atoms.

Examples of suitable groups for Z include, but are not limited to, alkylene having from 1-20 carbon atoms, phenylene, arylene having from 2 to 4 fused rings, bi-arylene, aza-alkylene having from 2-20 carbon atoms, and substituted versions thereof.

In one embodiment of Structure III, Z is selected from alkylene having from 1-6 carbon atoms; 1,2-cyclohexylene; 1,2-phenylene; 4-methoxy-1,2-phenylene; 4,5-dimethyl-1,2-phenylene; o-binaphthalene-diyl; 3-aza-1,5-pentylene; 1,2-o-tolyl-1,2-ethylene; 1,2-dicyano-1,2-ethylene; and 2-p-t-butylbenzyl-1,3-propylene.

In one embodiment of Structure III, Z is selected from ethylene, 1,2-cyclohexylene, and —$CH_2CH_2NHCH_2CH_2$—. The 1,2-cyclohexylene can be in either a cis or trans configuration.

In one embodiment of Formula I(a), Ar in ligand $L^1$ is selected from phenyl, biphenyl, and naphthyl. In one embodiment, the aromatic ring is further substituted with a group selected from an alkyl or aryl group.

In one embodiment, the metal Schiff base complex has Formula I(c) or I(d), $M(SB)_2L^1$   Formula I(c)

$M(SB)_3$   Formula I(d)

and SB has Structure IV. The metal is pentacoordinate in Formula I(c) and hexacoordinate in Formula I(d).

In one embodiment of Structure IV, $R^1$ and $R^2$ join together to form a 6-membered aromatic ring. In one embodiment, the aromatic ring is further substituted with a group selected from an alkyl group, a heteroalkyl group, an alkenyl group, a heteroalkenyl group, an alkynyl group, a heteroalkynyl group, an aryl group, including fused rings, a heteroaryl group, an alkoxy group, an aryloxy group, and halide. In one embodiment, the aromatic ring is selected from dichlorophenyl and alkylphenyl, where the alkyl has from 1 to 6 carbon atoms.

In one embodiment of Structure IV, $R^4$ is selected from alkyl having 1-20 carbon atoms and phenyl. In one embodiment, $R^4$ is further substituted with at least one group selected from halide and alkoxy groups.

In one embodiment of Formula I(c), Ar in ligand $L^1$ is selected from phenyl, biphenyl, and naphthyl. In one embodiment, the aromatic ring is further substituted with a group selected from an alkyl group and an aryl group.

In general, the Schiff base compounds can be prepared by the reaction of an aldehyde or a ketone with a primary amine, as illustrated schematically below:

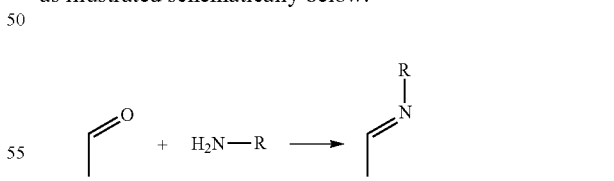

Such reactions are well known. Schiff base compounds having Structure I can be prepared by the reaction of a primary diamine with an hydroxy-aldehyde or ketone, in a 1:2 molar ratio. Schiff base compounds having Structure II can be prepared by the reaction of 2,2',2"-tris(aminoethyl)amine, having three primary amine groups, with an hydroxy-aldehyde or ketone, in a 1:3 molar ratio. Schiff base compounds having Structure III can be prepared by the reaction of a primary aminoalcohol with an hydroxy-aldehyde or ketone, in a 1:1 molar ratio. Schiff base compounds having Structure IV can be prepared by the reaction of a primary amine with an hydroxy-aldehyde or ketone, in a 1:1 molar ratio.

The metal Schiff base complex can generally be prepared by combining the Schiff base with a trivalent metal compound, in an appropriate solvent. Metal compounds such as metal alkoxides or organometallic compounds such as triethylaluminum can be used. Metal salts such as acetates, nitrates, or chlorides can also be used.

Organic electronic devices that may benefit from having one or more layers comprising a metal Schiff base complex include, but are not limited to, (1) devices that convert electrical energy into radiation (e.g., a light-emitting diode, light emitting diode display, or diode laser), (2) devices that detect signals through electronics processes (e.g., photodetectors, photoconductive cells, photoresistors, photoswitches, phototransistors, phototubes, IR detectors), (3) devices that convert radiation into electrical energy, (e.g., a photovoltaic device or solar cell), and (4) devices that include one or more electronic components that include one or more organic semiconductor layers (e.g., a transistor or diode).

One illustration of an organic electronic device structure is shown in FIG. 1. The device 100 has an anode layer 110 and a cathode layer 160, and a photoactive layer 130 between them. Adjacent to the anode is a layer 120 comprising hole transport material. Adjacent to the cathode is a layer 140 comprising an electron transport material. As an option, devices frequently use another electron transport layer or electron injection layer 150, next to the cathode.

The metal Schiff base complex can function as a host for the photoactive material in layer 130. When present as a host, the metal Schiff base complex should be physically compatible with the photoactive material, so that the materials do not separate into separate phases. The host is generally present in an amount greater than 50% by weight, based on the total weight of the photoactive layer. In one embodiment, the host is present in an amount greater than 60% by weight. In one embodiment, the host is present in an amount greater than 75% by weight. The metal Schiff base complex and photoactive material can be applied by a vapor co-deposition process, when applicable, by a solution deposition process from a common solution, or by a thermal transfer process.

The metal Schiff base complex can function as an electron transport material, hole blocking material, anti-quenching material, or combinations thereof, in layer 140. The metal Schiff base complex can be applied by a vapor deposition process, when applicable, by a solution deposition process, or by a thermal transfer process.

Depending upon the application of the device 100, the photoactive layer 130 can be a light-emitting layer that is activated by an applied voltage (such as in a light-emitting diode or light-emitting electrochemical cell), a layer of material that responds to radiant energy and generates a signal with or without an applied bias voltage (such as in a photodetector). Examples of photodetectors include photoconductive cells, photoresistors, photoswitches, phototransistors, and phototubes, and photovoltaic cells, as these terms are describe in Markus, John, *Electronics and Nucleonics Dictionary*, 470 and 476 (McGraw-Hill, Inc. 1966).

The other layers in the device can be made of any materials which are known to be useful in such layers. The anode 110, is an electrode that is particularly efficient for injecting positive charge carriers. It can be made of, for example materials containing a metal, mixed metal, alloy, metal oxide or mixed-metal oxide, or it can be a conducting polymer, and mixtures thereof. Suitable metals include the Group 11 metals, the metals in Groups 4, 5, and 6, and the Group 8-10 transition metals. If the anode is to be light-transmitting, mixed-metal oxides of Groups 12, 13 and 14 metals, such as indium-tin-oxide, are generally used. The anode 110 may also comprise an organic material such as polyaniline as described in "Flexible light-emitting diodes made from soluble conducting polymer," *Nature* vol. 357, pp 477-479 (11 Jun. 1992). At least one of the anode and cathode should be at least partially transparent to allow the generated light to be observed.

Examples of hole transport materials for layer 120 have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules include, but are not limited to: N,N'-diphenyl-N,N'-bis(3-methylphenyl)-[1,1'-biphenyl]-4,4'-diamine (TPD), 1,1-bis[(di-4-tolylamino)phenyl]cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis-(3-methylphenyl)-N,N,N',N'-2,5-phenylenediamine (PDA), a-phenyl-4-N,N-diphenylaminostyrene (TPS), p-(diethylamino)benzaldehyde diphenylhydrazone (DEH), triphenylamine (TPA), bis[4-(N,N-diethylamino)-2-methylphenyl](4-methylphenyl)methane (MPMP), 1-phenyl-3-[p-(diethylamino)styryl]-5-[p-(diethylamino)phenyl] pyrazoline (PPR or DEASP), 1,2-trans-bis(9H-carbazol-9-yl)cyclobutane (DCZB), N,N,N',N'-tetrakis(4-methylphenyl)-(1,1'-biphenyl)-4,4'-diamine (TTB), and porphyrinic compounds, such as copper phthalocyanine. Commonly used hole transporting polymers include, but are not limited to, polyvinylcarbazole, (phenylmethyl)polysilane, and polyaniline. It is also possible to obtain hole transporting polymers by doping hole transporting molecules such as those mentioned above into polymers such as polystyrene and polycarbonate.

Any organic electroluminescent ("EL") material can be used as the photoactive material in layer 130. Such materials include, but are not limited to, fluorescent dyes, fluorescent and phosphorescent metal complexes, conjugated polymers, and mixtures thereof. Examples of fluorescent dyes include, but are not limited to, pyrene, perylene, rubrene, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds. Examples of conjugated polymers include, but are not limited to poly(phenylenevinylenes), polyfluorenes, poly(spirobifluorenes), polythiophenes, poly(p-phenylenes), copolymers thereof, and mixtures thereof.

In one embodiment of the new device, the photoactive material is an organometallic complex. In one embodiment, the photoactive material is a cyclometalated complex of iridium or platinum. Complexes of Iridium with phenylpyridine, phenylquinoline, or phenylpyrimidine ligands have been disclosed as electroluminescent compounds in Petrov et al., Published PCT Application WO 02/02714. Other organometallic complexes have been described in, for example, published applications US 2001/0019782, EP 1191612, WO 02/15645, and EP 1191614. Electroluminescent devices with an active layer of polyvinyl carbazole (PVK) doped with metallic complexes of iridium have been described by Burrows and Thompson in published PCT applications WO 00/70655 and WO 01/41512. Electroluminescent emissive layers comprising a charge carrying host material and a phosphorescent platinum complex have been described by Thompson et al., in U.S. Pat. No. 6,303,238, Bradley et al., in Synth. Met. (2001), 116 (1-3), 379-383, and Campbell et al., in Phys. Rev. B, Vol. 65 085210. Examples of a few suitable iridium complexes are given in FIG. 6, as Formulae IV(a)

through IV(e). Analogous tetradentate platinum complexes can also be used. These electroluminescent complexes can be used alone, or doped into charge-carrying hosts, as noted above.

Examples of electron transport materials which can be used in optional layer 150 include metal chelated oxinoid compounds, such as tris(8-hydroxyquinolato)aluminum ($Alq_3$); and azole compounds such as 2-(4-biphenylyl)-5-(4-t-butylphenyl)-1,3,4-oxadiazole (PBD) and 3-(4-biphenylyl)-4-phenyl-5-(4-t-butylphenyl)-1,2,4-triazole (TAZ); phenanthrolines such as 4,7-diphenyl-1,10-phenanthroline (DPA) and 2,9-dimethyl-4,7-diphenyl-1,10-phenanthroline (DDPA); and mixtures thereof.

The cathode 160, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. Li-containing organometallic compounds, LiF, and $Li_2O$ can also be deposited between the organic layer and the cathode layer to lower the operating voltage.

It is known to have other layers in organic electronic devices. For example, there can be a layer (not shown) between the anode 110 and hole transport layer 120 to facilitate positive charge transport and/or band-gap matching of the layers, or to function as a protective layer. Layers that are known in the art can be used. In addition, any of the above-described layers can be made of two or more layers. Alternatively, some or all of anode layer 110, the hole transport layer 120, the electron transport layers 140 and 150, and cathode layer 160, may be surface treated to increase charge carrier transport efficiency. The choice of materials for each of the component layers is preferably determined by balancing the goals of providing a device with high device efficiency with device operational lifetime.

It is understood that each functional layer may be made up of more than one layer.

The device can be prepared by a variety of techniques, including sequentially depositing the individual layers on a suitable substrate. Substrates such as glass metal, ceramic and polymeric films and combinations thereof can be used. Conventional vapor deposition techniques can be used, such as thermal evaporation, chemical vapor deposition, and the like. Alternatively, the organic layers can be applied by liquid deposition using suitable solvents or other liquid media to create a solution, dispersion, emulsion or suspension. Typical liquid deposition techniques include, but are not limited to, continuous deposition techniques such as spin coating, gravure coating, curtain coating, dip coating, slot-die coating, casting, spray-coating, bar coating, roll coating, doctor blade coating and continuous nozzle coating; and discontinuous deposition techniques such as ink jet printing, gravure printing, and screen printing. Other techniques for appling organic layers include thermal transfer.

In one embodiment, the different layers have the following range of thicknesses: anode 110, 500-5000 Å, in one embodiment 1000-2000 Å; hole transport layer 120, 50-2000 Å, in one embodiment 200-1000 Å; photoactive layer 130, 10-2000 Å, in one embodiment 100-1000 Å; layers 140 and 150, 50-2000 Å, in one embodiment 100-1000 Å; cathode 160, 200-10000 Å, in one embodiment 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

As used herein, the term "alkyl" is intended to mean a group derived from an aliphatic hydrocarbon having one point of attachment. The term "alkenyl" is intended to mean a group derived from a hydrocarbon having one or more carbon-carbon double bonds and having one point of attachment. The term "alkynyl" is intended to mean a group derived from a hydrocarbon having one or more carbon-carbon triple bonds and having one point of attachment. The term "aryl" is intended to mean a group derived from an aromatic hydrocarbon having one point of attachment. The term "alkoxy" refers to an alkyl group attached to an oxygen atom, and further attached to another molecule by the oxygen. The term "aryloxy" refers to an aryl group attached to an oxygen atom, and further attached to another molecule by the oxygen.

The term "group" is intended to mean a part of a compound, such as a substituent in an organic compound or a ligand in a complex.

The term "compound" is intended to mean an electrically uncharged substance made up of molecules that further consist of atoms, wherein the atoms cannot be separated by physical means.

The term "layer" is used interchangeably with the term "film" and refers to a coating covering a desired area. The area can be as large as an entire device or a specific functional area such as the actual visual display, or as small as a single sub-pixel. Films can be formed by any conventional deposition technique, including vapor deposition and liquid deposition.

The term "organometallic compound" is intended to mean a compound having a metal-carbon bond. The organometallic compound may include metal atoms from Groups 3 through 15 of the Periodic Table and mixtures thereof.

The term "tetracoordinate" is intended to mean that four groups or points of attachment are coordinated to a central metal. The term "pentacoordinate" is intended to mean that five groups or points of attachment are coordinated to a central metal. The term "hexacoordinate" is intended to mean that six groups or points of attachment are coordinated to a central metal.

The term "charge transport" is intended to refer to a material that can receive a charge from an electrode and facilitate its movement through the thickness of the material with relatively high efficiency and small loss of charge. Electron transport materials are capable of receiving a negative charge from a cathode and transporting it. The term "hole blocking" refers to a material which prevents, retards, or diminishes the transfer of a hole through the thickness of the material. The term "anti-quenching" is intended to refer to a material which prevents, retards, or diminishes both the transfer of energy and the transfer of an electron to or from the excited state of the photoactive layer to an adjacent layer.

The prefix "hetero" indicates that one or more carbon atoms has been replaced with a different atom.

Unless otherwise indicated, all groups can be unsubstituted or substituted, and, when applicable, all groups can be linear, branched or cyclic. The phrase "adjacent to," when used to refer to layers in a device, does not necessarily mean that one layer is immediately next to another layer. On the other hand, the phrase "adjacent R groups" is used to refer to R groups that are next to each other in a chemical formula (i.e., R groups that are on atoms joined by a bond).

The IUPAC number system is used throughout, where the groups from the Periodic Table are numbered from left to right as 1-18 (CRC Handbook of Chemistry and Physics, 81$^{st}$ Edition, 2000).

As used herein, the phrase "X is selected from the group consisting of A, B, and C" is intended to mean that X is A, or X is B, or X is C. The phrase "X is selected from 1 through n" is intended to mean that X is 1, or X is 2, . . . or X is n.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Unless otherwise defined, all letter symbols in the figures represent atoms with that atomic abbreviation. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

EXAMPLES

The following examples illustrate certain features and advantages of the present invention. They are intended to be illustrative of the invention, but not limiting. All percentages are by weight, unless otherwise indicated.

Examples 1-6

Examples 1-6 illustrate the preparation of Schiff base complexes having Formula I(a)

$$M(SB)L^1 \quad \text{Formula I(a)}$$

where the Schiff base ligand has Structure I.

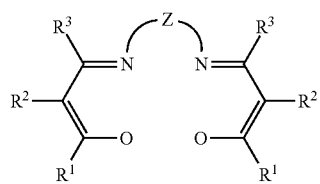

Structure (I)

Example 1

This example illustrates the preparation of Complex 1. Schiff base compound SB-1 was first prepared:

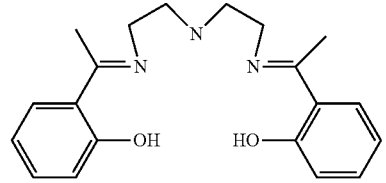

SB-1

Schiff base compound SB-1 was prepared by taking 5.15 g diethylenetriamine into 250 mL methanol under nitrogen and adding 13.6 g 2-hydroxyacetophenone also in 250 mL methanol. After refluxing under nitrogen with vigorous stirring, the solution turned yellow and solid formed in the flask. TLC confirmed that the reaction was complete, and the solid was recovered by filtration and extensive washing with methanol. Yield 93%.

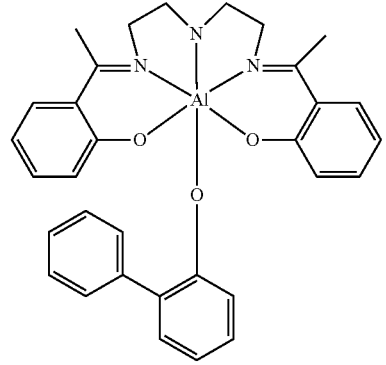

Complex 1

2.04 g aluminum isopropoxide and 3.4 g SB-1 were taken into 50 mL warm ethanol in a nitrogen-filled glove box and stirred with mild warming until completely dissolved. To this was added 1.7 g 2-phenylphenol with continued heating and stirring. While stirring, the solution rapidly solidified and the pale yellow solid was collected by filtration and washed with ethanol. After suction drying the solid was poorly soluble in methylene chloride. Analysis by nmr in d6-DMSO confirmed the composition as Complex 1. Yield 76%.

Example 2

This example illustrates the preparation of Complex 2.

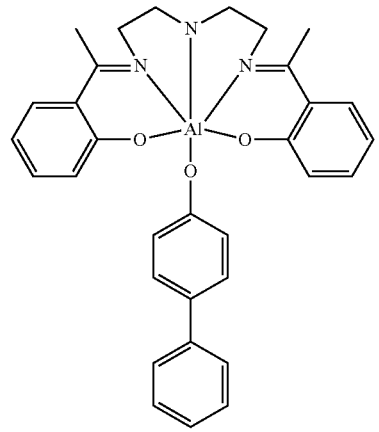

Complex 2

2.04 g aluminum isopropoxide and 3.4 g SB-1 were taken into 50 mL warm ethanol in a nitrogen-filled glove box and stirred with mild warming until completely dissolved. To this was added 1.7 g 4-phenylphenol with continued heating and stirring. While stirring, the solution rapidly solidified and the pale yellow solid was collected by filtration and washed with ethanol. After suction drying the solid was poorly soluble in methylene chloride. Analysis by nmr in d6-DMSO confirmed the composition as Complex 2. Yield 85%.

Example 3

This example illustrates the preparation of Complex 3.

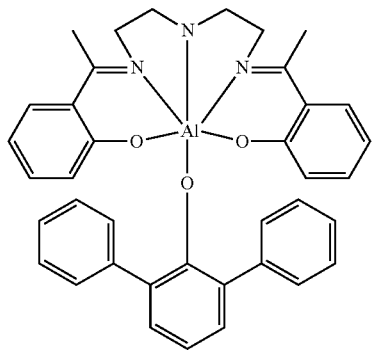

Complex 3

2.04 g aluminum isopropoxide and 3.4 g SB-1 were taken into 50 mL warm ethanol in a nitrogen-filled glove box and stirred with mild warming until completely dissolved. To this was added 2.5 g 2,6-diphenylphenol with continued heating and stirring. While stirring the solution rapidly solidified and the pale yellow solid was collected by filtration and washed with ethanol. After suction drying the solid was poorly soluble in methylene chloride. Analysis by nmr in d6-DMSO confirmed the composition as Complex 3. Yield 69%.

Example 4

This example illustrates the preparation of Complex 4.
Schiff base compound SB-2 was first prepared:

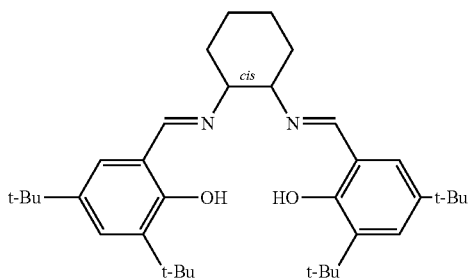

SB-2

SB-2 was prepared by dissolving 9.38 g 3,5-di-t-butylbenzaldehyde into a minimum volume of hot methanol in a flask and adding 2.3 g cis-diaminocyclohexane predissolved in 50 mL methanol. This mixture was refluxed under nitrogen for 4 hours, checking progress with TLC. The cooled solution was filtered to collect yellow crystals of the desired product, which were washed extensively with cold methanol. Yield 91%.

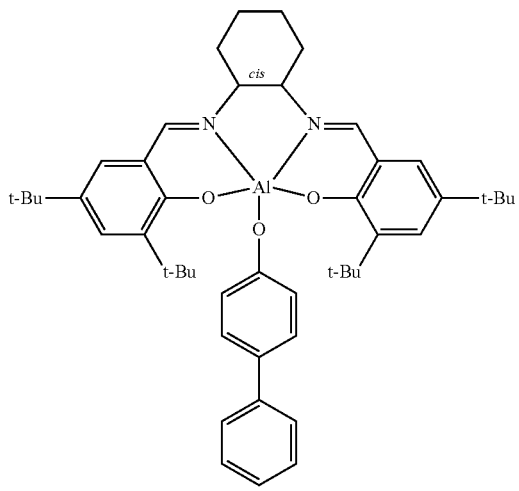

Complex 4

2.04 g aluminum isopropoxide and 3.0 g SB-2 were dissolved into a mixed solvent of methylene chloride and ethanol (1:1 by volume, total volume of 100 mL) in a nitrogen-filled glove box. 1.7 g of 4-phenylphenol solid was added and stirred vigorously while heating in the glove box. This mixture was refluxed for 30 minutes, then cooled. The methylene chloride was removed by evaporation. The resultant pale yellow solid was collected by filtration, washed well with ethanol, and suctioned dry. Yield 77%.

Example 5

This example illustrates the preparation of Schiff base complex, Complex 5.
Schiff base compound SB-3 was first prepared:

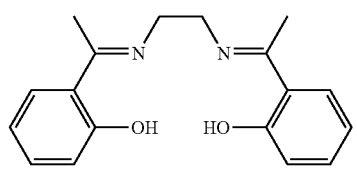

SB-3

SB-3 was prepared by taking 13.6 g 2-hydroxyacetophenone into 50 mL methanol and adding 1 mL acetic acid. With vigorous stirring, 3.0 g ethylene diamine also dissolved in 50 mL methanol was added. After 4 hrs reflux, the solution was cooled and the solid crystals recovered by filtration and extensive washing with cold methanol. Yield 87%.

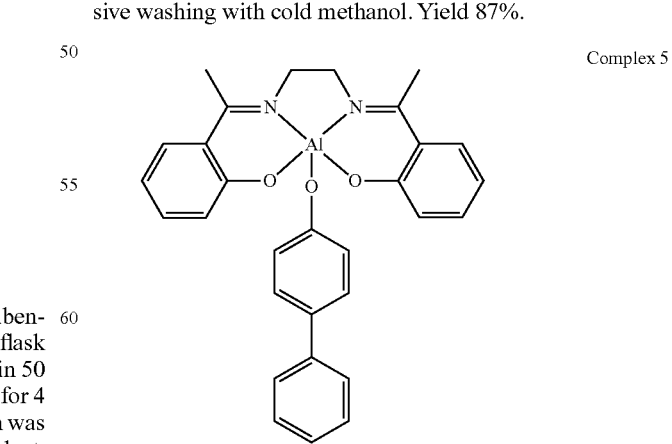

Complex 5

In a nitrogen-filled glove box, 6 mL triethylaluminum in hexane (1M) was added to a solution of 1.8 g SB-3 in 50 mL toluene with vigorous stirring. Care was taken to avoid foaming. This was refluxed briefly to dissolve, after which a cloudy precipitate formed. Then 0.34 g 4-phenylphenol was added to the cooled solution slowly to avoid foaming. This was heated and stirred for over 30 minutes at close to boiling. After cooling, a crystalline white precipitate was collected.

Example 6

This example illustrates the preparation of Schiff base complex, Complex 6.

Schiff base compound SB-4 was first prepared:

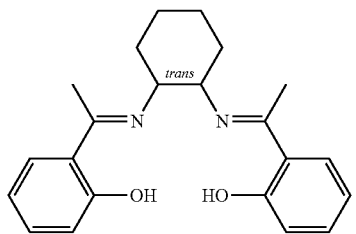

SB-4

Compound SB-4 was prepared by taking 13.6 g 2-hydroxyacetophenone into 50 mL methanol and adding 1 mL acetic acid. With vigorous stirring, 5.7 g trans-1,2-cyclohexyldiamine also dissolved in 50 mL methanol was added. After 4 hrs reflux, the solution was cooled and the solid crystals recovered by filtration and extensive washing with cold methanol. Yield 93%.

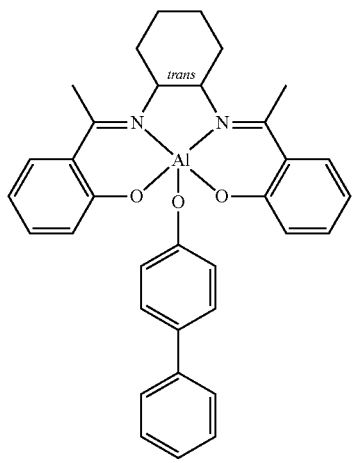

Complex 6

In a nitrogen-filled glove box, 2 mL triethylaluminum in hexane (1M) was added to a solution of 0.72 g SB-4 in 10 mL toluene with vigorous stirring. To this was added 0.34 g 4-phenylphenol. This was heated and stirred for >30 minutes at close to boiling. After cooling, the pale yellow/white solid precipitate was collected. The solid was washed well with toluene and dried in the glove box.

Examples 7-30

Examples 7-30 illustrate the preparation of Schiff base complexes having Formula I(b), M(SB)　　　　　　　　　　　　　　　Formula I(b)

and SB has Structure II(a)

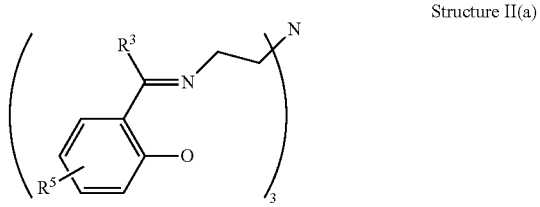

Structure II(a)

Schiff Base Compound SB-5

In this compound $R^3$ is H, and $R^5$ is 5,6-fused phenyl.

4.87 g tris-(2-aminoethyl)amine was dissolved into 100 mL dry methanol and then mixed with 17.22 g 2-hydroxy-1-naphthaldehyde also dissolved in 100 mL dry methanol. The mixture was stirred under nitrogen at reflux for 4 hours and then allowed to cool to room temperature, at which point a yellow precipitate had formed. The solid was collected by filtration and washed well with methanol and dried in vacuum.

Schiff Base Compound SB-6

In this compound $R^3$ is H, and $R^5$ is 3,5-di-t-butyl.

2.92 g of tris-(2-aminoethyl)amine was dissolved into 50 mL dry methanol and then mixed with 14.06 g 3,5-di-t-butyl-2-hydroxybenzaldehyde also dissolved in 50 mL dry methanol. The mixture was stirred under nitrogen at reflux for 4 hours and then allowed to cool to room temperature at which point a yellow precipitate had formed. The solid was collected by filtration and washed well with methanol and dried in vacuum.

Schiff Base Compound SB-7

In this compound, $R^3$ is methyl, and $R^5$ is H.

2.92 g of tris-(2-aminoethyl)amine was dissolved into 50 mL dry methanol and then mixed with 8.16 g 2'-hydroxyacetophenone also dissolved in 50 mL dry methanol. The mixture was stirred under nitrogen at reflux for 4 hours and then allowed to cool to room temperature at which point a yellow ppt had formed. The solid was collected by filtration and washed well with methanol and dried in vacuum.

Schiff Base Compound SB-8

In this compound, $R^3$ is H, and $R^5$ is 3-methoxy.

Schiff Base Compound SB-9

In this compound, $R^3$ is H, and $R^5$ is H.

Schiff Base Compound SB-10

In this compound, $R^3$ is H, and $R^5$ is 3,5-dichloro.

Schiff Base Compound SB-11

In this compound, $R^3$ is H, and $R^5$ is 4-diethylamino.

Aluminum Complexes:

These were prepared in a nitrogen-filled glove box by mixing a solution of the Schiff base compound in toluene with a solution of triethylaluminum in hexane, in an approximately 3:1 molar ratio. The mixture evolved ethane gas. It was stirred for 1 hour, during which time a solid formed. This solid was collected by filtration, washed well with hexanes and dried in vacuo.

Other Metal Complexes:

These were prepared by dissolving the Schiff base compound in methanol or a methanol/methylene chloride mixture, and then adding a metal salt dissolved in methanol, in an approximately 3:1 molar ratio. The salts used were acetates (Y, Sm, Eu, Gd, Tb, Ln, Tm), nitrates (Ga, In), or chlorides (Sc). The mixture was warmed and stirred overnight. The solid was collected by filtration or evaporation.

All the Schiff base complexes were recrystallized from DMF/methanol (SB-5), toluene/hexane (SB-6), or methylene chloride/hexane (SB-7, SB-8, SB-9, SB-10, SB-11).

The metal Schiff base complexes are summarized in Table 1.

TABLE 1

Metal Schiff Base Complexes Having Formula I(b)

| Example | Metal | Schiff Base |
|---------|-------|-------------|
| 7 | Al | SB-5 |
| 8 | Sc | SB-5 |
| 9 | Y | SB-5 |
| 10 | Al | SB-6 |
| 11 | Sm | SB-6 |
| 12 | Eu | SB-6 |
| 13 | Gd | SB-6 |
| 14 | Tb | SB-6 |
| 15 | Sc | SB-6 |
| 16 | Y | SB-6 |
| 17 | Ga | SB-6 |
| 18 | In | SB-6 |
| 19 | La | SB-6 |
| 20 | Tm | SB-6 |
| 21 | Al | SB-7 |
| 22 | Sc | SB-7 |
| 23 | Eu | SB-7 |
| 24 | Tb | SB-7 |
| 25 | Y | SB-7 |
| 26 | Sm | SB-7 |
| 27 | Y | SB-8 |
| 28 | Y | SB-9 |
| 29 | Y | SB-10 |
| 30 | Y | SB-11 |

All thicknesses are in Angstroms.

Schiff bases having Structures III and IV were prepared in a similar manner as those described above. The appropriate monoamine compound was selected and reacted in a 1:1 molar stoichiometry with the selected aldehyde or ketone.

Example 31-35

These examples illustrate the use of the metal Schiff base complexes in an OLED device.

General Procedure

OLED devices were fabricated by the thermal evaporation technique. The base vacuum for all of the thin film deposition was in the range of $10^{-6}$ torr. The deposition chamber was capable of depositing eight different films without the need to break the vacuum. Patterned indium tin oxide coated glass substrates from Thin Film Devices, Inc were used. These ITO's are based on Corning 1737 glass coated with 1400 Å ITO coating, with sheet resistance of 30 ohms/square and 80% light transmission. The patterned ITO substrates were then cleaned ultrasonically in aqueous detergent solution. The substrates were then rinsed with distilled water, followed by isopropanol, and then degreased in toluene vapor.

The cleaned, patterned ITO substrate was then loaded into the vacuum chamber and the chamber was pumped down to $10^{-6}$ torr. The substrate was then further cleaned using an oxygen plasma for about 5 minutes. After cleaning, multiple layers of thin films were then deposited sequentially onto the substrate by thermal evaporation. Patterned metal electrodes (Al or LiF/Al) were deposited through a mask. The thickness of the films was measured during deposition using a quartz crystal monitor. The completed OLED device was then taken out of the vacuum chamber and characterized immediately without encapsulation.

The OLED samples were characterized by measuring their (1) current-voltage (I-V) curves, (2) electroluminescence radiance versus voltage, and (3) electroluminescence spectra versus voltage. The I-V curves were measured with a Keithley Source-Measurement Unit Model 237. The electroluminescence radiance (in units of $cd/m^2$) vs. voltage was measured with a Minolta LS-110 luminescence meter, while the voltage was scanned using the Keithley SMU. The electroluminescence spectrum was obtained by collecting light using an optical fiber, through an electronic shutter, dispersed through a spectrograph, and then measured with a diode array detector. All three measurements were performed at the same time and controlled by a computer. The efficiency of the device at a certain voltage is determined by dividing the electroluminescence radiance of the LED by the current density needed to run the device. The unit is a cd/A.

The devices had the structure shown in FIG. 1. Layer 140 was either a metal Schiff base complex, or, in the comparative example, BAlQ. The materials had the structures shown below.

MPMP:

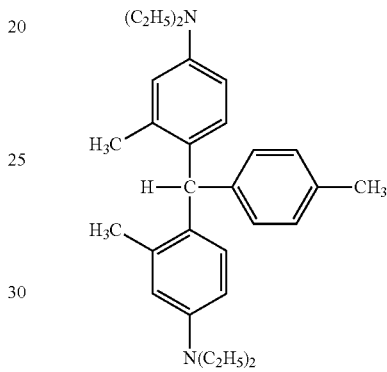

G1, a green emitter:

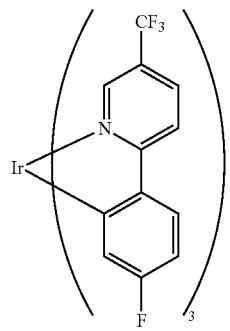

BAlQ:

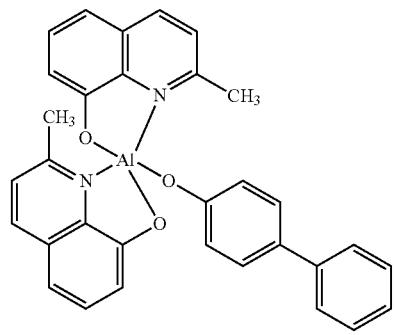

AlQ:

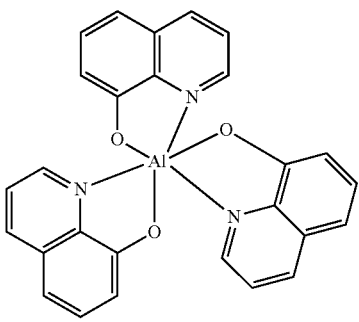

Device materials and layer thicknesses are summarized in Table 2. The device properties are given in Table 3.

TABLE 2

Device Architecture

| Example | Layer 120 | Layer 130 | Layer 140 | Layer 150 | Layer 160 |
|---|---|---|---|---|---|
| Comp. A | MPMP 301 | G1 404 | BAlQ 101 | AlQ 302 | LiF - 10 Al - 505 |
| 31 | MPMP 304 | G1 402 | Complex 4 102 | AlQ 303 | LiF - 10 Al - 505 |
| 32 | MPMP 303 | G1 402 | Complex 1 103 | AlQ 303 | LiF - 10 Al - 505 |
| 33 | MPMP 304 | G1 404 | Complex 2 104 | AlQ 303 | LiF - 10 Al - 300 |
| 34 | MPMP 302 | G1 402 | Complex 6 101 | AlQ 301 | LiF - 10 Al - 504 |
| 35 | MPMP 304 | G1 402 | Complex 5 102 | AlQ 303 | LiF - 10 Al - 505 |

All thicknesses are in Angstroms.

TABLE 3

Device Properties

| Example | Peak Radiance cd/m$^2$ | Peak Efficiency cd/A |
|---|---|---|
| Comparative A | 9300 at 16 V | 26 |
| 31 | 6000 at 21 V | 21 |
| 32 | 8000 at 19 V | 17 |
| 33 | 6200 at 19 V | 27 |
| 34 | 6000 at 19 V | 20 |
| 35 | 8000 at 24 V | 19 |

Example 36

This example illustrates the low level of luminance quenching of Complex 2.

In one embodiment, the metal Schiff base complexes disclosed herein have low photo-luminescence quenching efficiency towards emitters. If a host or an electron transport material shows high photoluminescence quenching efficiency, the device will show low electroluminescent efficiency, especially if the recombination zone is in contact with the material. To measure the quenching efficiency, the following photoluminescent quenching experiments were performed.

The luminescence quenching of an excited molecule can be described as $$A^* + Q = X \quad (1)$$

where A* represents the luminescent excited state of the emitter, Q represents the quencher (in this case the charge transport or host molecule under study), and X represents the product of the quenching reaction. The degree of quenching can be evaluated quantitatively by determining the rate constant of the luminescence quenching, $k_q$, in the above equation. The value of $k_q$ can be obtained, for example, by the well-known Stern-Volmer equation:

$$(I_q/I_0) - 1 = k_q \tau_0 [Q] \quad (2)$$

where $I_q$ represents the luminescence intensity of the emitter in the presence of the quencher, $I_0$ represents the intensity in the absence of the quencher, $\tau_0$ is the luminescent excited state lifetime in the absence of the quencher, and [Q] is the concentration of the quencher. By plotting $(I_q/I_0) - 1$ vs [Q], the slope of the straight line gives $k_q \tau_0$, which is known as the Stern-Volmer quenching constant. If $\tau_0$ is known, then one obtains the luminescence quenching rate constant, $k_q$. Even if the exact value of $\tau_0$ were unknown, the quenching rate constants of different charge transport and/or anti-quenching materials may be accurately compared because $\tau_0$ is a constant.

Figure 2:
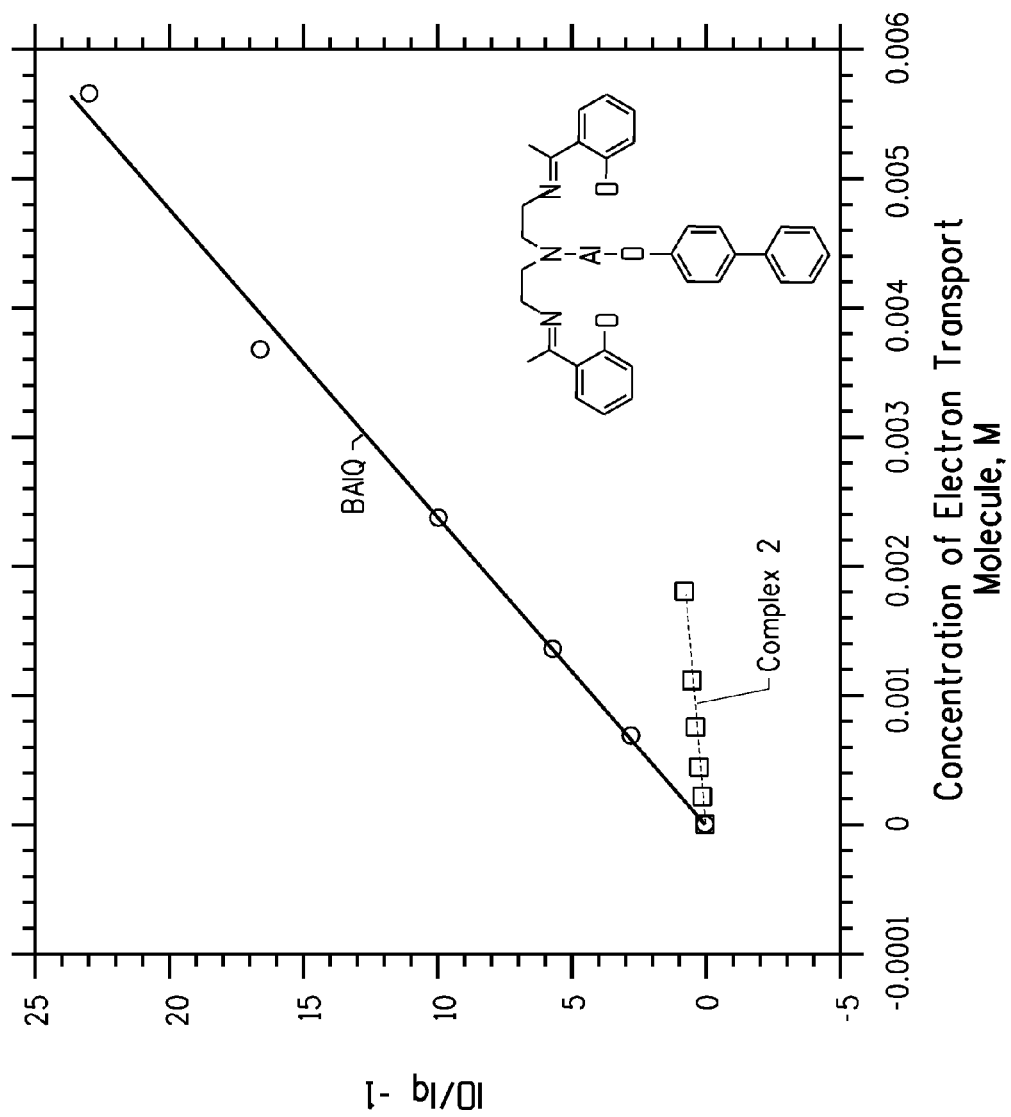
FIG. 2: A graph of luminance quenching vs. concentration of a metal Schiff base complex, BAlQ.

FIG. 2 compares the Stern-Volmer quenching plots of Complex 2 and BAlQ, towards the G1 green emitter. The slope of the line gives the Stern-Volmer quenching constant. Complex 2 has a Stern-Volmer quenching constant of 497, compared to BAlQ with a Stern-Volmer quenching constant of 4142. This indicates complex 2 has a lower luminance quenching effect towards G1, and therefore intrinsically a better electron transport or host material.

What is claimed is:

1. An organic electronic device comprising a cathode, a layer comprising a photoactive material positioned therebetween and a metal Schiff base complex, wherein the metal Schiff base complex is present as a host for the photoactive material or in a layer between a cathode and the photoactive material containing layer or in both layers, wherein the metal Schiff base complex has Formula I(a)

M(SB)L$^1$           Formula I(a)

wherein

M is a metal in a +3 oxidation state;
L$^1$ is a ligand having the formula Ar—O, where Ar is selected from an aromatic group and a heteroaromatic group;
SB is a Schiff base ligand having Structure I:

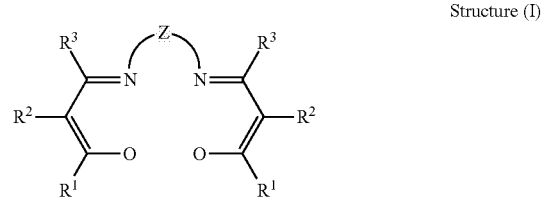

wherein:
R$^1$, R$^2$, R$^3$ are the same or different and are independently selected from hydrogen, alkyl, heteroalkyl, aryl, and heteroaryl, or adjacent R groups can join together to form 5- or 6-membered rings; and
Z is selected from 4-methoxy-1,2-phenylene; 4,5-dimethyl-1,2-phenylene; o-binaphthalene-diyl; 3-aza-1,5-pentylene; 2-p-t-butylbenzyl-1,3propylene; and —CH$_2$CH$_2$NHCH$_2$CH$_2$—.

2. A device according to claim 1 wherein Ar is selected from phenyl, biphenyl, and naphthyl.

* * * * *